United States Patent [19]

Jones

[11] Patent Number: 4,698,531

[45] Date of Patent: Oct. 6, 1987

[54] POWER-ON RESET CIRCUIT

[75] Inventor: Keith L. Jones, Middlesex, England

[73] Assignee: The General Electric Company, p.l.c., England

[21] Appl. No.: 885,861

[22] Filed: Jul. 15, 1986

[30] Foreign Application Priority Data

Jul. 24, 1985 [GB] United Kingdom ............... 8518692

[51] Int. Cl.⁴ .................. H03K 5/13; H03K 3/26; H03F 3/04
[52] U.S. Cl. ................... 307/592; 307/279; 307/288; 307/594; 307/597; 307/700 B; 307/593; 307/296 R; 330/288
[58] Field of Search ............ 307/592, 594, 593, 597, 307/279, 288, 200 A, 200 B; 330/288

[56] References Cited

U.S. PATENT DOCUMENTS 4,591,745  5/1986  Shen ........................... 307/592

Primary Examiner—Stanley D. Miller
Assistant Examiner—M. R. Wambach
Attorney, Agent, or Firm—Kirschstein, Kirschstein, Ottinger & Israel

[57] ABSTRACT

An integrated-circuit power-on reset arrangement which starts in a known state due to transistor sizing and to a current mirror circuit at least initially holding a bistable circuit in a predetermined one of its states.

4 Claims, 1 Drawing Figure

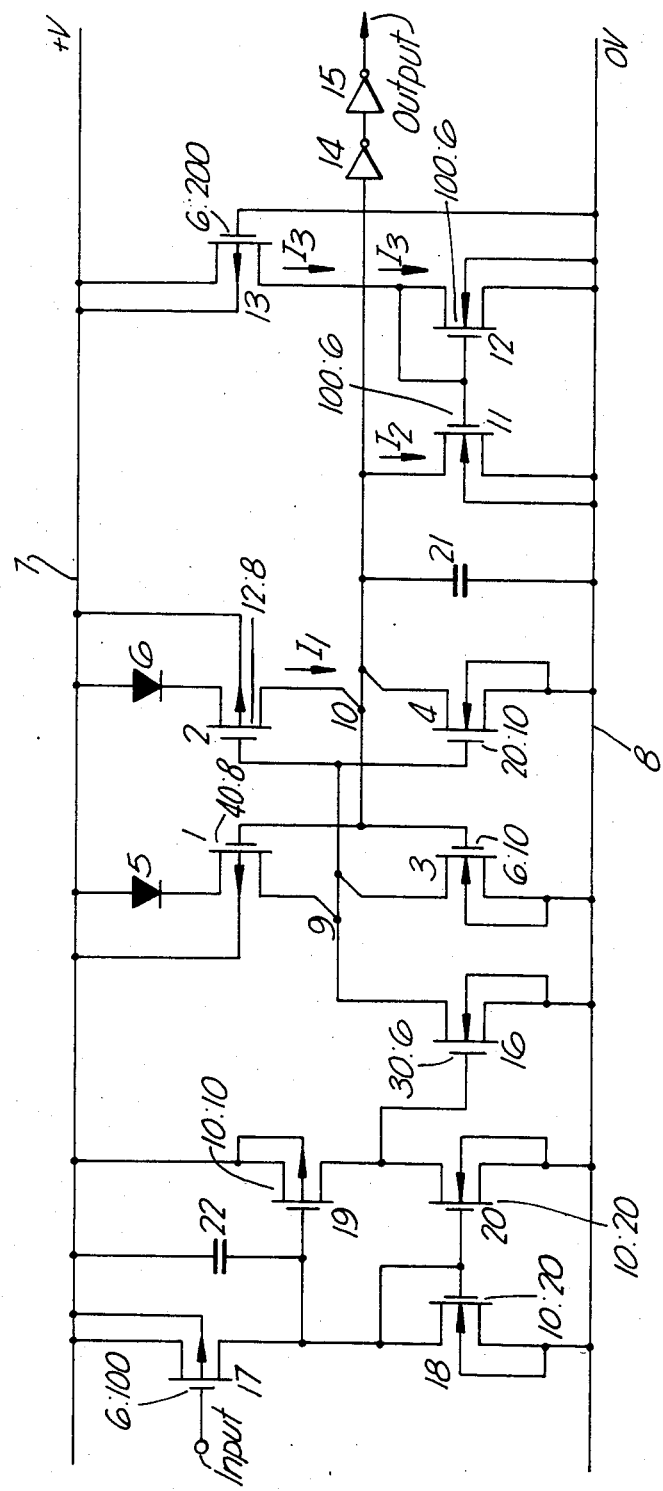

POWER-ON RESET CIRCUIT

BACKGROUND OF THE INVENTION

1. Field of the Invention

The present invention relates to power-on reset circuits. In particular but not exclusively the invention is concerned with power-on reset circuit arrangements for use in CMOS integrated circuits.

2. Description of Related Art

The purpose of a power-on reset circuit is to initialize logic and memory elements as the power supply voltage is raised from a very low level, that is, to set such elements to a known initial state. To do this the reset circuit must itself start in a known state. Reset circuits are used for example in calculators and electronic telephone sets.

The voltage at which a reset circuit is required to operate is a function of the operating voltage range of the associated circuits. If the reset circuit operates at too high a voltage, then logic and memory elements may be reset while still being supplied with a usable voltage, and in many applications the lower the voltage at which the reset circuit operates the longer the memory elements will retain stored information.

Reset circuits fall broadly within two categories, those in which the power supply voltage increases rapidly so that capacitors may be used to determine the reset state, and those in which the supply voltage increases or decreases slowly so that some form of level-detector circuit is required. Circuits designed for slowly changing supply voltages can usually be modified fairly readily, by the addition of capacitors, to deal also with rapidly changing supply voltages.

In some known reset circuits for dealing with slowly changing supply voltages the detection voltage level is determined by the sum of n and p channel transistor threshold voltage, plus an additional margin which may include the threshold voltage of a diode in series with the transistors. Such reset circuits are commonly referred to as sum-of-threshold circuits. However, memory elements will usually hold down to supply voltages of less than half of this sum-of-threshold voltage, so that such reset circuits tend to operate at too high a voltage.

SUMMARY OF THE INVENTION

According to one aspect of the present invention an integrated-circuit power-on reset circuit arrangement comprises a transistor bistable circuit the transistors of which have unequal channel widths such that said bistable circuit tends to set to a predetermined one of its two stable states as a supply voltage to the circuit arrangement rises from substantially zero value.

According to another aspect of the present invention an integrated-circuit power-on reset circuit arrangement comprises a bistable circuit and a current mirror circuit arranged to provide a conductive path between an output of said bistable circuit and one power supply conductor of the circuit arrangement, the value of current flow in said conductive path as a supply voltage to the circuit arrangement rises from substantially zero value being sufficient to maintain the potential of said output of the bistable circuit substantially at the potential of said one power supply conductor at least until the value of said supply voltage exceeds a predetermined value.

According to another aspect of the present invention an integrated-circuit power-on reset circuit arrangement comprises a bistable circuit which is arranged such that leakage currents in transistor devices of said bistable circuit tend to set said bistable circuit to a predetermined one of its two stable states as a supply voltage to the circuit arrangement rises from substantiallly zero value, and a current mirror circuit arranged to provide a conductive path between an output of said bistable circuit and one power supply conductor of the circuit arrangement, the value of current flow in said conductive path as said supply voltage rises from substantially zero value being sufficient to maintain the potential of said output of the bistable circuit substantially at the potential of said one power supply conductor, and thereby tend to set said bistable circuit to said predetermined state, at least until the value of said supply voltage exceeds a predetermined value.

BRIEF DESCRIPTION OF THE DRAWING

A power-on reset circuit arrangement in accordance with the present invention will now be described by way of example with reference to the single FIGURE accompanying drawing, which shows the circuit arrangement diagrammatically.

DETAILED DESCRIPTION OF THE PREFERRED EMBODMENT

Referring to the drawing the reset circuit comprises transistors 1 to 4 and diodes 5 and 6, which are connected to form a bistable circuit which is arranged to be energized by way of power supply conductors 7 and 8. The bistable circuit has a first stable state, in operation, in which a junction or node 9 is high, that is at a voltage close to that of the positive supply conductor 7, and a junction or node 10 is low, that is at a voltage close to that of the zero voltage supply conductor 8, and a second stable state in which the node 9 is low and the node 10 is high.

The channels of the p-channel transistors 1 and 2 are of the same length, but the channel of transistor 1 is much wider than that of transistor 2, as indicated by the channel measurements in microns shown in the drawing. Thus, as indicated, the channel of transistor 1 is forty microns wide and eight microns long. Also, in respect of the channels of the n-channel transistors 3 and 4 that of the transistor 4 is much wider than that of the transistor 3. Due to these inequalities if the supply voltage between the conductors 7 and 8 rises slowly from zero the imbalance in transistor gains and leakage currents assist in forcing the bistable circuit to the first of the above-mentioned stable states, in which the node 9 is high and the node 10 is low.

Two further n-channel transistors 11 and 12 form a current mirror circuit whose function is to draw a current $I_2$ closely equal to a current $I_3$ the value of which is determined by a p-channel transistor 13, the transistor 13 being a low-current low-gain device.

At values of supply voltage below the sum of the threshold voltages of the transistor 2 and the diode 6, but at voltages above those at which leakage currents dominate, the value of current $I_2$ is grater than the value of current $I_1$ then flowing through the transistor 2 and the diode 6, and the node 10 is thereby held low.

Thus as the supply voltage rises slowly from zero, initially the leakage currents in the transistors 1 to 4 tend to set the bistable circuit to the state in which node 10 is low. At slightly higher supply voltages the current mirror circuit tends to hold the node 10 low. When the supply voltage exceeds the sum of thresholds of the transistor 2 and the diode 6 by some margin the state of the bistable circuit itself determines whether the node 10 is low or high. An output from the node 10, for example by way of inverters 14 and 15, may be used as a reset signal, which reset signal may be removed by setting the bistable circuit to the state in which the node 10 is high, say by a suitable logic input at the node 9.

The logic input is applied by means of a transistor 16 which, if conducting, will remove the reset signal when the supply voltage exceeds the sum of thresholds value referred to in the preceding paragraph. Since the threshold voltage of the transistor 2 is of the order of one volt and the threshold voltage of the diode 6 is of the order of half a volt, the value of supply voltage at which the bistable circuit will change over is of the order of one and a half volts. By comparison a known sum of thresholds reset circuit operates at supply voltages more than two volts, and with additional series diodes would operate at more than two and a half volts.

The input to remove the reset condition may be an event, such as the operation of a push-button on a calculator or a telephone keypad. Alternatively the present reset circuit may be combined, as shown in the drawing, with a conventional sum of threshold circuit comprising transistors 17 to 20, which may be designed so that its output to the transistor 16 changes at supply voltages of two and a half volts between the conductors 7 and 8. With the input to transistor 17 connected to the supply conductor 8 the output from the combined circuit arrangement would hold the reset condition until the supply voltage rises above two and a half volts, and would not provide the reset on falling supply voltage until this is below one and half volts. In other words the arrangement provides hysteresis.

If the input to transistor 17 is an event, as referred to above, then removal of reset by the event will be permitted if the supply voltage is above two and a half volts, but again the reset will not be provided until the supply voltage has fallen below one and a half volts.

If the input to the transistor 17 is taken from the output of the inverter 15 the operation is similar to that with the input to the transistor 17 connected to the zero volt conductor 8, except that once the reset has been removed by a rising supply voltage the transistor 17 is switched off and the transistors 18, 19 and 20 draw virtually no current until the supply voltage has fallen below one and a half volts and the reset condition has been reestablished. This minimizes current consumption of the circuit arrangement in the critical range of low but viable supply voltages.

Capacitors 21 and 22 serve to ensure that the circuit arrangement starts in the reset state if the supply voltage rises rapidly from zero.

I claim:

1. An integrated circuit having first and second power supply conductors for energizing said integrated circuit, and a power-on reset circuit arrangement, comprising:

a bistable circuit including a first output node, a first active device and means connecting said first active device between said first power supply conductor and said first output node, and a current mirror circuit including a second active device and means connecting said second active device between said first output node of said bistable circuit and said second power supply conductor, wherein the currents which flow in said first and second active devices between said first and second power supply conductors as the potential difference between said supply conductors rises from a zero value are such that the potential at said first output node is held essentially at that of said second power supply conductor, for utilization as a resetting signal potential until said potential difference exceeds a predetermined value.

2. An arrangement in accordance with claim 1, wherein said first and second active devices are respectively p-channel and n-channel metal oxide semiconductor (MOS) transistors, the channel of said second active device being wider than that of said first active device.

3. An arrangement in accordance with claim 1, wherein the value of current flow in said current mirror circuit is determined by a long-channel low-gain active device.

4. An arrangement in accordance with claim 1, wherein the potential at said first output node, held essentially at that of said second power supply conductor, is utilized as a resetting signal; and further comprising circuit means for changing the state of said bistable circuit such that said first output node is held at a potential other than that of said second power supply conductor, whereby said resetting signal is removed.

* * * * *